United States Patent

Yamane

[11] Patent Number: 5,718,796
[45] Date of Patent: Feb. 17, 1998

[54] DRY ETCHING SYSTEM

[75] Inventor: Tetsuya Yamane, Nagasaki, Japan

[73] Assignee: Sony Corporation, Tokyo, Japan

[21] Appl. No.: 638,470

[22] Filed: Apr. 26, 1996

[30] Foreign Application Priority Data

May 2, 1995 [JP] Japan ................. 7-131160

[51] Int. Cl.$^6$ ................................. H01L 21/00
[52] U.S. Cl. ............. 156/345; 156/626.1; 216/60
[58] Field of Search ............. 156/626.1, 345 MT, 156/345 P; 216/59, 60

[56] References Cited

U.S. PATENT DOCUMENTS

| 4,479,848 | 10/1984 | Otsubo et al. | 156/345 X |
| 5,045,149 | 9/1991 | Nulty | 156/345 X |

Primary Examiner—William Powell
Attorney, Agent, or Firm—Ronald P. Kananen

[57] ABSTRACT

An etching system including a chamber, lower and upper electrodes provided in the chamber, a plasma light monitoring window provided in a side wall of the chamber, and an endpoint detecting device mounted outside the plasma light monitoring window. The plasma light monitoring window may be formed of high-purity aluminum oxide ($Al_2O_3$) as a transparent ceramic, so that plasma light generated in the chamber can be efficiently transmitted through the plasma light monitoring window to the endpoint detecting device. Accordingly, even when the plasma light monitoring window is etched, its transparency is not lost. Furthermore, since the content of impurity in the window is low, contamination of an object to be etched with the impurity can be suppressed.

11 Claims, 3 Drawing Sheets

CONTENTS OF HEAVY METALS IN CERAMICS : ppm

| Na | Ca | K | Si | Fe | Mg | Ti |
|---|---|---|---|---|---|---|
| 25 | 4 | 11 | 120 | 10 | 450 | 1 |
| 280 | 290 | 84 | 230 | 69 | 1300 | 19 |
| 290 | 310 | 110 | 190 | 48 | 1400 | 18 |

CONTENTS OF HEAVY METALS
IN LOW-IMPURITY CERAMIC : ppm

| Mg | Si | Fe | Na | Ca | K |
|---|---|---|---|---|---|
| 250 | 40 | <1 | <1 | <1 | <1 |

DRY ETCHING SYSTEM

BACKGROUND OF THE INVENTION

The present invention relates to a dry etching system for performing dry etching in the manufacturing process of a semiconductor device.

In a dry etching system, ceramic or quartz is the material widely used for every structure provided within a chamber for storing an object such as a wafer during etching. For example, in a dry etching system including an endpoint detecting device for monitoring the color of plasma light and detecting an endpoint of etching based on the plasma light, quartz is widely used as the material for a window for monitoring the plasma light.

However, in a dry etching system employing ceramic as the material for the structure within the chamber, a problem occurs in that the structure itself is etched, and various heavy metals (Na, Ca, K, Fe, Mg, etc.) are generated from the structure because of a low purity of the ceramic. This causes contamination of a wafer with such heavy metals.

Further, in a dry etching system employing quartz as the material for the plasma light monitoring window of the endpoint detecting device, the following problems occur. First, as the dry etching process proceeds, the plasma light monitoring window (quartz) itself is etched by radicals and ions excited by the plasma. Accordingly, plasma light generated by the etching of a substrate or wafer cannot be distinguished from that of the etching of the quartz window, so that the endpoint of etching of an object cannot be properly detected. Secondly, when the plasma light monitoring window of quartz is etched, the transparency of the window is lost. Accordingly, it is necessary to periodically eliminate the loss of transparency of the window (as by polishing) or exchange the window itself, causing an increase in operating cost.

OBJECTS AND SUMMARY OF THE INVENTION

It is accordingly a first object of the present invention to provide a dry etching system which can stably detect an etching endpoint.

It is a second object of the present invention to provide a dry etching system which can suppress contamination of a wafer during etching.

According to the present invention, there is provided a dry etching system for removing a part of an object to be etched by gasification. The system comprises a chamber for storing the object; and a structure provided within the chamber, being formed of a transparent member containing a small amount of impurity. Preferably, the transparent member comprises a transparent ceramic such as high-purity aluminum oxide ($Al_2O_3$).

Preferably, a bell jar forming an inner wall of the chamber is used as the structure, and the bell jar is formed of a transparent ceramic or the like containing a small amount of impurity. Preferably, the dry etching system further comprises an endpoint detecting device for detecting an etching endpoint by analyzing the spectrum of plasma light generated from a plasma in a gas atmosphere; and a plasma light monitoring window for introducing to the endpoint detecting device the plasma light generated from the plasma in the gas atmosphere. The plasma light monitoring window is formed of a transparent ceramic or the like containing a small amount of impurity.

In the dry etching system of the present invention, the structure provided within the chamber is formed of a transparent ceramic or the like. Accordingly, even when the structure is etched, the generation of heavy metals from the structure due to etching can be suppressed.

In the dry etching system of the present invention, the plasma light monitoring window directed to the endpoint detecting device is formed of a transparent ceramic or the like. Accordingly, it is possible to achieve not only the suppression of heavy metals released from the window by etching, but also the prevention of loss of transparency of the window.

DETAILED DESCRIPTION OF THE PREFERRED EMBODIMENTS

Some preferred embodiments of the present invention will now be described with reference to the drawings.

Figures 1, 2:
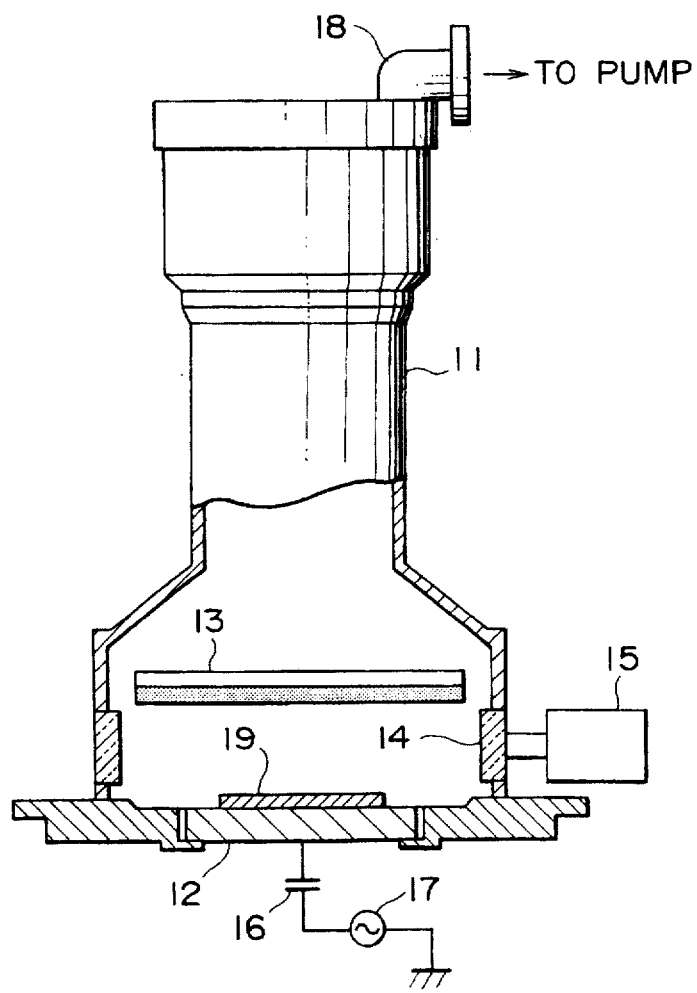
FIG. 1 is an illustration of the contents of heavy metals in ceramics in the related art.
FIG. 2 is a partially sectional view showing the configuration of a dry etching system according to a first preferred embodiment of the present invention.

FIG. 2 shows the configuration of a dry etching system, partially in section, according to a first preferred embodiment of the present invention. The exemplary dry etching system shown in FIG. 2 is a reactive ion etching (RIE) system. The RIE system includes a chamber 11 for retaining a plasma atmosphere, a pair of parallel planar electrodes (lower electrode 12 and upper electrode 13) vertically opposed to each other in the chamber 11, a plasma light monitoring window 14 provided in a side wall of the chamber 11, an endpoint detecting device 15 mounted outside the plasma light monitoring window 14, a high-frequency power source 17 connected through a capacitor 16 to the lower electrode 12, and an outlet 18 connected to a vacuum pump (not shown) for evacuating the chamber 11. A semiconductor wafer 19 as an object to be etched is placed on the upper surface of the lower electrode 12. The upper electrode 13 is grounded.

Figure 3:
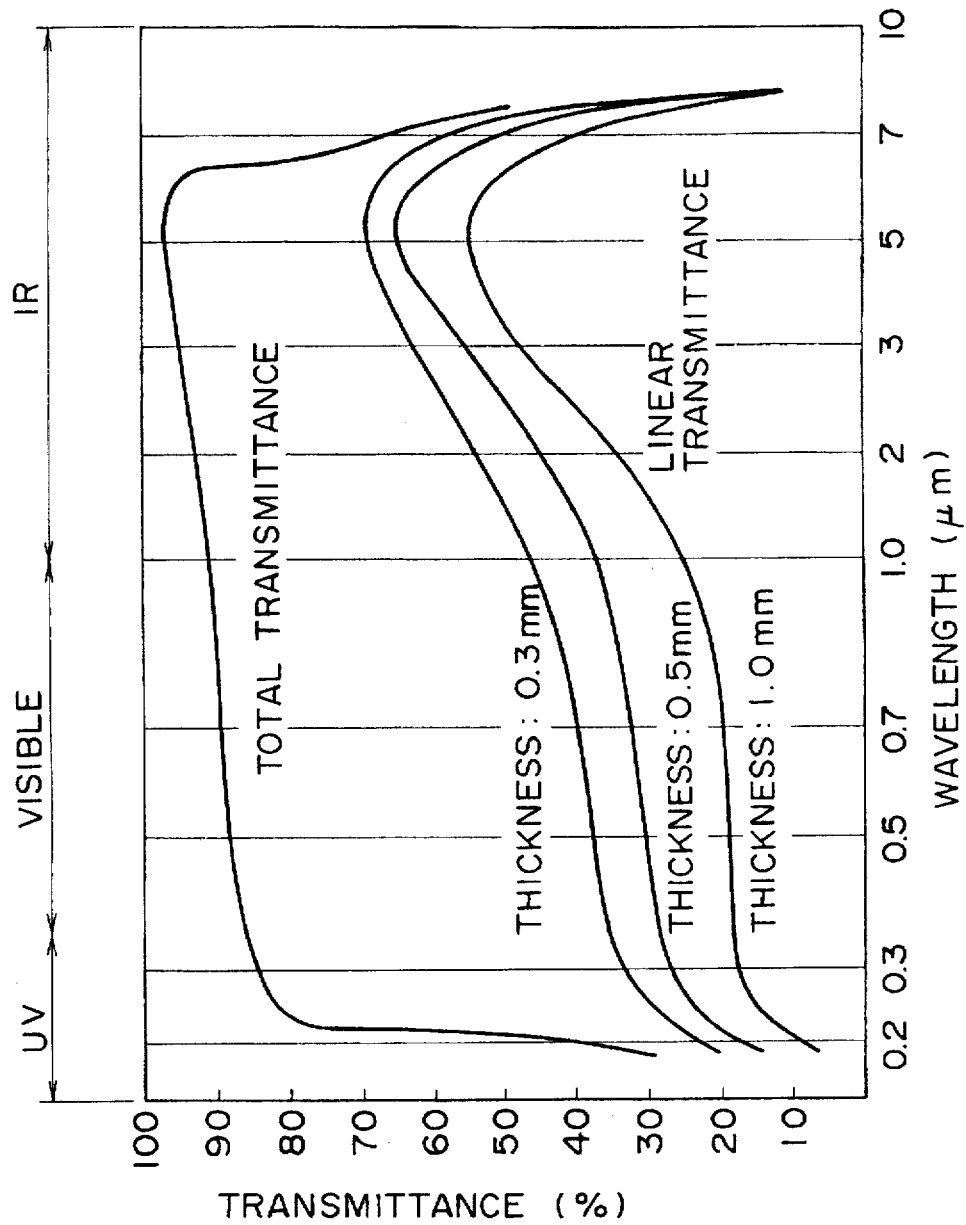
FIG. 3 is a graph showing an example of light transmission characteristics of a transparent ceramic in the present invention.

The plasma light monitoring window 14 is formed of high-purity aluminum oxide ($Al_2O_3$) which is one of the transparent ceramics which can be used as the transparent member described in the Summary of the Invention. The Light monitoring window will efficiently transmit the plasma light generated in the chamber 11 and lead it to the endpoint detecting device 15. An example such transparent ceramic is one named "SAPPAL" offered by TOSHIBA CERAMICS CO., LTD. As shown in FIG. 3, the transparent ceramic forming the plasma light monitoring window 14 has an excellent total transmittance and linear transmittance over the whole wavelength range from the ultraviolet region to the infrared region. The "total transmittance" will be used herein to denote transmittance accounting for absorption only, and the "linear transmittance" will be used herein to denote transmittance accounting for both absorption and scattering.

The operation of the dry etching system according to the first preferred embodiment will now be described. When a high-frequency voltage is applied to the lower electrode 12 with the upper electrode 13 grounded, a plasma is generated between the two electrodes 12 and 13, and at the same time a dc negative potential is generated at the lower electrode 12. As a result, reactive fluorine ions, for example, in the plasma are accelerated toward the lower electrode 12 and perpendicularly collide with the semiconductor wafer 19. Accordingly, physical etching by sputtering and chemical etching are performed simultaneously to allow selective anisotropic etching.

A portion of the wafer surface thus etched becomes a plasma and generates light having a wavelength distinctive of the atoms or molecules in the plasma. This plasma light is transmitted through the plasma light monitoring window 14 to the endpoint detecting device 15, in which wavelength detection is performed. When the etching reaches a silicon substrate lying beneath a subject layer to be etched, plasma light indicative of silicon atoms is detected. At this time, it is decided that the etching has bee complied, i.e., reached an endpoint. The etching is then terminated. In this process, the high-purity aluminum oxide forming the plasma light monitoring window 14 is also etched. However, since the wavelength of plasma light generated by etching of the window 14 is different from the wavelength of plasma light generated by etching of the silicon substrate, there is no possibility of overlap of the wavelengths of plasma light in the case of using a quartz window as There has bee in the related art preventing endpoint detection. Furthermore, there is also no possibility that the plasma light monitoring window 14 may lose its transparency. The window 14 can also transmit enough light over the wide wavelength range from the ultraviolet region to the infrared region to allow detection of the various wavelengths indication various kinds of substrate lying beneath the subject layer to be etched. Further, it is Largely unnecessary to replace the plasma light monitoring window 14, thereby facilitating the maintenance of the system.

Figures 4, 5:
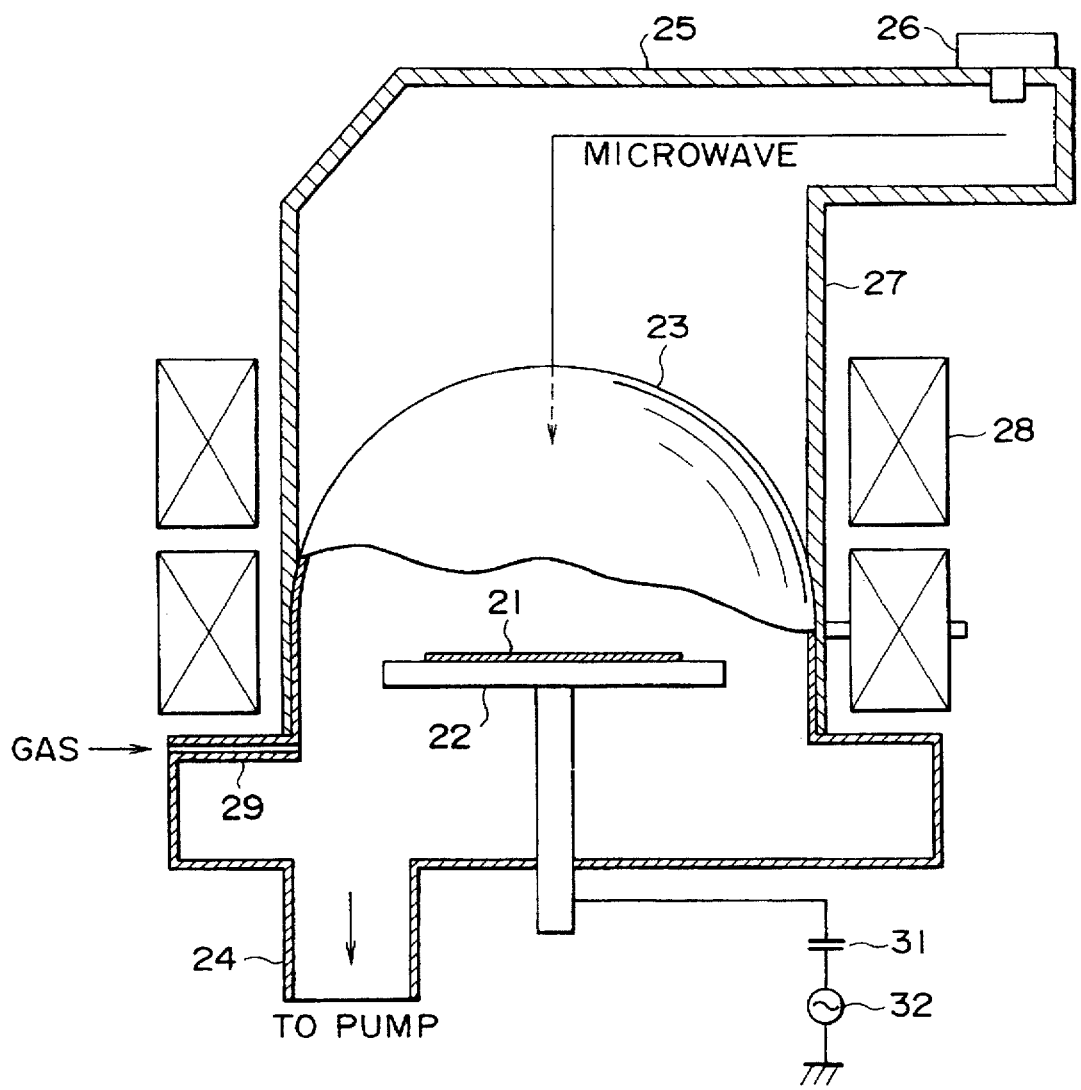
FIG. 4 is a schematic view showing the configuration of a dry etching system according to a second preferred embodiment of the present invention.
FIG. 5 is an illustration of the contents of heavy metals in the transparent ceramic in the present invention.

FIG. 4 schematically shows the configuration of a dry etching system according to a second preferred embodiment of the present invention. This system is called a microwave plasma etcher, which is one kind of RIE systems. This system includes a planar electrode 22 on which a semiconductor wafer 21 is placed, a bell jar 23 housing the planar electrode 22, an outlet 24 connected to a vacuum pump (not shown) for evacuating the bell jar 23, a magnetron 26 for supplying a microwave through a waveguide 25 into the bell jar 23, a magnet coil 28 provided outside a chamber 27, and a gas inlet 29 for introducing an etching gas. The planar electrode 22 is connected through a capacitor 31 to a high-frequency power source 32. The bell jar 23 is formed of a transparent member e.g., transparent ceramic such as high-purity aluminum oxide.

The operation of the microwave plasma etcher according to the second preferred embodiment of the present invention will now be described. When the interior of the bell jar 23 is evacuated and a microwave is directed to the bell jar 23 by the magnetron 26, a plasma is generated in the bell jar 23. As shown in FIG. 5, the transparent ceramic (e.g., "SAPPAL" mentioned above) as an example of the transparent member, forming the bell jar 23, contains extremely small amounts of heavy metals. Accordingly, even when the bell jar 23 is etched, possible contamination of the semiconductor wafer 21 with these heavy metals can be greatly suppressed.

When a high-frequency voltage is applied to the planar electrode 22, a dc electric field is generated at the planar electrode 22 like in the first preferred embodiment (FIG. 2). As a result, reactive element ions in the plasma perpendicularly collide with the semiconductor wafer 21 to perform anisotropic etching. When a magnetic field is applied to the plasma by the operation of the magnet coil 28 provided around the chamber 27, electrons in the plasma exhibit circular motion to improve the ionization efficiency of neutral gas molecules, thereby remarkably increasing the ion density in the plasma.

As described above, according to the dry etching system of the present invention, the structure provided within the chamber is formed of a transparent ceramic or the like containing a small amount of impurity. Accordingly, even when the structure is etched, the generation of heavy metals can be suppressed to thereby suppress contamination of an object being etched.

In particular, according to the dry etching system in an aspect of the present invention, the plasma light monitoring window directed to the endpoint detecting device is formed of a transparent ceramic or the like. Accordingly, not only the generation of heavy metals can be suppressed, but also the loss of transparency of the plasma light monitoring window can be prevented. That is, even when the transparent ceramic forming the plasma light monitoring window is etched, it can still transmit the plasma light over the wide wavelength range from the ultraviolet region to the infrared region, thereby supporting various wavelengths resulting from the various kinds of substrate lying beneath a subject layer being etched. Further, it is unnecessary to frequently replace the plasma light monitoring window, thereby facilitating the maintenance of the system and accordingly reducing a the operating cost.

What is claimed is:

1. A dry etching system for removing a part of an object to be etched by gasification, comprising:
   a chamber for containing said object; and
   a structure provided within said chamber, said structure being formed of a transparent member containing a small amount of impurity.

2. A dry etching system according to claim 1, wherein said transparent member comprises a transparent ceramic.

3. A dry etching system according to claim 1, wherein said impurity comprises heavy metals.

4. A dry etching system according to claim 2, wherein said transparent ceramic comprises high-purity aluminum oxide.

5. A dry etching system according to claim 1, wherein said structure comprises a bell jar forming an inner wall of said chamber.

6. A dry etching system for etching an object in a gas atmosphere containing a plasma, comprising:
   completion of the endpoint detecting device for detecting an etching by analyzing a spectrum of plasma light generated from said plasma in said gas atmosphere; and
   a plasma light monitoring window for introducing to said endpoint detecting device said plasma light generated from said plasma in said gas atmosphere, said plasma light monitoring window being formed of a transparent member containing a small amount of impurity.

7. A dry etching system according to claim 6, wherein said transparent member comprises a transparent ceramic.

8. A dry etching system according to claim 7, wherein said transparent ceramic transmits light over a wavelength range from an ultraviolet region to an infrared region.

9. A dry etching system according to claim 8, wherein said transparent ceramic has a transmittance of not less than 10% over the ultraviolet region to the infrared region.

10. A dry etching system according to claim 8, wherein said plasma light monitoring window formed of said transparent ceramic has a thickness of less than 1.0 mm.

11. A dry etching system according to claim 6, wherein said impurity comprises heavy metals.

* * * * *